United States Patent [19]

Brennan et al.

[11] Patent Number: 5,783,481
[45] Date of Patent: Jul. 21, 1998

[54] SEMICONDUCTOR INTERLEVEL DIELECTRIC HAVING A POLYMIDE FOR PRODUCING AIR GAPS

[75] Inventors: William S. Brennan; Robert Dawson; H. Jim Fulford, Jr.; Fred N. Hause; Basab Bandyopadhyay, all of Austin; Mark W. Michael, Cedar Park, all of Tex.

[73] Assignee: Advanced Micro Devices, Inc., Sunnyvale, Calif.

[21] Appl. No.: 659,167

[22] Filed: Jun. 5, 1996

[51] Int. Cl.⁶ .......................... H01L 21/44; H01L 21/48
[52] U.S. Cl. .......................... 438/623; 438/624
[58] Field of Search .......................... 438/622, 623, 438/624, 625, 626, 628, 629, 631, 632

[56] References Cited

U.S. PATENT DOCUMENTS

| | | | |
|---|---|---|---|
| 5,310,700 | 5/1994 | Lien et al. | 438/624 |
| 5,382,547 | 1/1995 | Sultan et al. | 438/624 |
| 5,403,780 | 4/1995 | Jain et al. | 438/624 |
| 5,470,793 | 11/1995 | Kalnitshy | 438/624 |
| 5,641,712 | 6/1997 | Grivna et al. | 438/624 |

Primary Examiner—Brian Dutton
Attorney, Agent, or Firm—Kevin L. Daffer; Conley. Rose & Tayon

[57] ABSTRACT

A dielectric material is provided having air gaps which form during dielectric deposition between horizontal or vertical spaced conductors. The dielectric is deposited upon a polyimide, wherein the polyimide is placed over and between an underlying level of conductors. As the overlying dielectric is deposited on the polyimide, the polyimide material outgasses to form air separation between the polyimide and dielectric. Air separation is particularly prevalent in regions between closely spaced conductors and in high elevational areas directly above each conductor. The dielectric deposition process preferably includes two deposition cycles. A first deposition temperature is used to force significant outgassing, and a second deposition cycle is needed to close any and all keyhole openings which might exist between closely spaced conductors. A combination of polyimide, air gaps (air-filled cavities) and deposited dielectric forms an inter-level dielectric structure having a low dielectric permittivity or dielectric constant in critical conductor spaces.

17 Claims, 2 Drawing Sheets

5,783,481

SEMICONDUCTOR INTERLEVEL DIELECTRIC HAVING A POLYIMIDE FOR PRODUCING AIR GAPS

BACKGROUND OF THE INVENTION

1. Field of the Invention

This invention relates to semiconductor fabrication and more particularly to a polyimide film placed between horizontally and vertically displaced conductors. Desorption of the polymide film during overlying dielectric deposition causes air-filled cavities (air gaps) to form at the polymide-dielectric juncture, and specifically above and between select conductors arranged within an interconnect level.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are sealed by an upper layer of dielectric material. Accordingly, the layers of conductors overlaid with a dielectric present a topography upon which a subsequent layer or layers of conductors can be patterned. Each layer is herein referred to as an interconnect layer, comprising numerous, patterned interconnect lines or conductors.

Conductors are made from an electrically conductive material, a suitable material includes Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and spaced by a dielectric above an underlying conductor or substrate by a dielectric thickness $T_{d1}$. Each conductor is dielectrically spaced from other conductors within the same level of conductors by a distance $T_{d2}$. Accordingly, conductor-to-substrate capacitance $C_{LS}$ (i.e., capacitance between conductors on different levels) is determined as follows:

$$C_{LS} = eW_L L/T_{d1} \quad \text{(Eq. 1)}$$

Further, the conductor-to-conductor capacitance $C_{LL}$ (i.e., capacitance between conductors on the same level) is determined as follows:

$$C_{LL} = eW_c L/T_{d2} \quad \text{(Eq. 2)}$$

where e is the permittivity of the dielectric material (the dielectric material between the conductor and substrate or the dielectric material between conductors), $W_L$ is the conductor width, $T_c$ is the conductor thickness, and L is the conductor length. Resistance of the conductor is calculated as follows:

$$R = (rL)/W_L T_c \quad \text{(Eq. 3)}$$

where r represents resistivity of the conductive material, and $T_c$ is the interconnect thickness. Combinations of equations 1 and 3, and/or equations 2 and 3 indicate the propagation delay of a conductor as follows:

$$RC_{LS} = reL^2/T_c T_{d1}$$

$$RC_{LL} = reL^2/W_L T_{d2}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible given the geometric constraints of the semiconductor topography.

Propagation delay is a function of both capacitance $C_{LS}$ as well as capacitance $C_{LL}$. Accordingly, propagation delay is determined by parasitic capacitance values ($C_{LL}$) between laterally spaced conductors, and parasitic capacitance values ($C_{LS}$) between vertically spaced conductors (or between a conductor and the underlying substrate). As circuit density increases, lateral spacing between conductors decrease and capacitance $C_{LL}$ increases. FIG. 1 evidences the relationship between $C_{LL}$ and $C_{LS}$. As circuit density increases, spacing between horizontally displaced conductors arranged within the same level decreases causing capacitance $C_{LL}$ to becomes predominant relative to $C_{LS}$. FIG. 1 illustrates the effect of line-to-line (intralevel) spacing on $C_{LL}$.

Increases in $C_{LL}$ pose two major problems. First, an increase in $C_{LL}$ generally causes an increase in the time at which a transition on the one end of the conductor occurs at the other end. Increase in transition time (i.e., increase in speed degradation) thereby requires a longer drive period. If the conductor extends along a critical speed path, speed degradation on the line will jeopardize functionality of the overall circuit. Second, a larger $C_{LL}$ causes an increase in crosstalk noise. A conductor which does not transition, nonetheless receives crosstalk noise from neighboring lines which do.

Similar to $C_{LL}$, increase in $C_{LS}$ also causes speed problems. Planarization mandates to some extent a decrease in vertical spacing in certain areas. Shallow trench processing, recessed LOCOS processing, and multi-layered interlevel dielectrics may bring about an overall reduction in vertical spacing and therefore an increase in $C_{LS}$. Integrated circuits which employ narrow intralevel dielectrics thereby define $C_{LL}$ as a predominant capacitance, and integrated circuits which employ regions of thin interlevel dielectrics define $C_{LS}$ as a predominant capacitance.

It is thereby important to minimize propagation delay especially in critical speed path. Given the constraints of chemical compositions, it is not readily plausible to reduce the resistivity r of conductor materials. Geometric constraints make it difficult to increase conductor thickness $T_c$ or dielectric thickness $T_{d1}$ or $Td_2$. Still further, instead of reducing length L of a conductor, most modern integrated circuits employ long interconnect lines which compound the propagation delay problems.

Accordingly, a need arises for instituting a reduction in propagation delay but within the chemical and geometric constraints of existing fabrication processes. It would therefore be beneficial to derive a fabrication process which can reduce propagation delay by reducing the permittivity e of dielectric material. More specifically, the desired process must be one which reduces permittivity of dielectric material arranged between horizontally displaced or vertically displaced conductors. As such, it would be of benefit to employ a fabrication technique in which dielectrics arranged between horizontally displaced conductors (intralevel dielectric) or between vertically displaced conductors (interlevel dielectric) achieve low permittivity.

SUMMARY OF THE INVENTION

The problems outlined above are in large part solved by a fabrication process which produces a low permittivity dielectric between interconnect lines. Low permittivity (or low dielectric constant) is achieved by a process which purposefully forms an air gap within select regions of the dielectric. According to one embodiment, the low-dielectric-constant dielectric is formed as an intralevel dielectric between conductors on the same level. According to another embodiment, the low-dielectric-constant dielectric is formed as an interlevel dielectric between conductors on different levels.

Permittivity of air within the air gap is less than that of the surrounding dielectric material, such as oxide, nitride, oxynitride, etc. Accordingly, presence of an air gap within the dielectric causes an overall decrease in dielectric constant in the intralevel or interlevel positions. Reduction in permittivity results in a lessening of the line-to-line capacitance $C_{LL}$ and the line-to-substrate capacitance $C_{LS}$. Reduction in $C_{LL}$ and/or $C_{LS}$ causes a corresponding reduction in propagation delay $RC_{LL\ or\ LS}$. Incorporation of an air gap thereby reduces propagation delay and proves beneficial in meeting speed requirements within critical path interconnect lines horizontally or vertically spaced from each other within a bus structure.

The air gap is formed by outgassing solvents from a deposited polyimide layer. Accordingly, the present process entails a polyimide layer deposited over and between conductors arranged within an interconnect level. The polyimide layer is deposited in liquid form from a polyamic-acid precursor. The liquid form is spin-on deposited, similar to the process used to deposit photoresist or spin-on glass (SOG). After the polyimide is deposited, it is then cured to change its composition to a solid form. The curing process drives a substantial amount of solvent from the polyimide. Even after curing, the polyimide nonetheless retains some solvent which is advantageously used to form air gaps in a subsequently deposited dielectric.

After the polyimide is cured, a dielectric is deposited upon and between polyimide-coated conductors. The dielectric is preferably deposited using chemical vapor deposition (CVD) technique. CVD employs deposition within a chamber heated to a temperature necessary not only to bring about deposition but also to outgas at least a portion of the remaining solvent from the polyimide.

Outgassing occurs during the CVD process, causing an opening (or keyhole) to form within the dielectric. The keyhole generally forms at high elevation regions and preferably between closely spaced conductors. The keyhole naturally occurs arranged along a midline above a spacing which separates closely spaced conductors (i.e., conductors spaced less than 10.0 microns apart). Without being bound by theory, it is postulated that keyhole formation is more likely between closely spaced conductors since the planarization features of the polyimide leave more polyimide in close spacings than distal spacings, thereby leadings to a preponderance of outgassing in areas where polyimide is greater. The combination of a large quantity of outgassing polyimide and the upper elevation to which the outgas material rises, causes the keyhole to form at or near the midline area. Lower elevational polyimide surfaces between sparsely spaced polyimide-covered conductors readily receive the deposited dielectric, causing any outgassing associated with that polyimide surface to migrate upward about the upper elevational regions (i.e., between closely spaced conductors and directly above the polyimide-covered conductors).

The presence of air gaps above conductors lowers the permittivity of dielectric between vertically spaced conductors. Accordingly, air gap above conductors helps lessen the interlevel dielectric capacitance $C_{LS}$ in areas directly between vertically spaced conductors—where lower $C_{LS}$ is most beneficial. Air gaps between conductors, and specifically between closely spaced conductors, within the same interconnect level also lessen $C_{LL}$ in critical areas between only closely spaced conductors.

While outgassing initiates the formation of a keyhole, it is necessary to complete an air gap by filling that keyhole. According to one embodiment, the keyhole is formed by elevating the CVD temperature during an initial deposition cycle. The elevated temperature causes substantial outgassing of solvent from the polyimide. After a period of time has elapsed, a significant portion of the entrained solvent has been outgassed such that outgassing is virtually stopped when a subsequent lower CVD temperature is used. Cessation of outgassing during the second, lower temperature deposition step allows the dielectric material to accumulate along cusps which extend inward near the midline. Sufficient amounts of accumulation will close the keyhole, leaving an air-filled cavity (air gap) in the beneficial described above. There are many instances, however, where a keyhole may not formed. Those instances occur when sparsely patterned conductors are encountered. Outgassing to the upper surfaces of sparsely patterned, polyimide-covered conductors are fully retained in a pocket or cavity at the juncture between the polyimide and overlying dielectric directly above the sparsely spaced conductors. Since the conductors are sparsely spaced, sufficient polyimide does not exist between such conductors as would be necessary to form a keyhole attributable to significant outgassing. Accordingly, air gaps are advantageously formed in two critical locations: directly between closely spaced conductors (as an interlevel dielectric) and directly above both closely spaced and sparsely spaced conductors (as an interlevel dielectric). In either instance, the air gaps are beneficial in reducing $C_{LL}$ and $C_{LS}$.

Broadly speaking, the present invention contemplates a method for forming a dielectric between a first set and a second set of conductors, wherein the first and second set of conductors are arranged within substantially dissimilar elevational levels. The method includes the steps of forming, in a single patterning step, a first set of conductors spaced from each other upon a dielectric-covered semiconductor topography. A layer of polymer or polyimide is then formed upon and between the first set of conductors to form a polymer-covered set of conductors. A dielectric is then deposited upon and between the polymer-covered set of conductors, wherein the dielectric is deposited in the presence of thermal energy sufficient to form air gaps within the dielectric at a midline between closely spaced polymer-covered set of conductors, i.e., which are spaced less than 10.0 microns apart. A second set of conductors is then formed, in a single patterning step, upon the dielectric to complete the multilevel interconnect structure.

The polymer is generally deposited using various spin-on technique, followed by a curing cycle. The dielectric is preferably deposited in two steps, the first step is a high temperature deposition step and the second step is a lower temperature deposition step. The first step causes a first layer of dielectric to form upon the polyimide at a temperature sufficient to outgas moisture from the polyimide and through an opening formed within the dielectric. Alternatively, the dielectric can be deposited in a single step with a properly designed deposition process. A second layer of dielectric is thereafter deposited upon the first layer of dielectric at a temperature sufficient to close the opening and encapsulate an air gap within the first and second layers of dielectric. If conductor spacings are such that a keyhole does not form then, according to an alternative embodiment, the second layer of dielectric material need not be deposited. In the former instance, the first layer of dielectric need only be used such that it is deposited at a temperature sufficient to outgas moisture from the polyimide to upper elevational regions of the polyimide.

The present invention further contemplates an interlevel dielectric structure arranged between two levels of interconnect. The inter-level dielectric structure comprises an air-filled cavity formed between a polyimide layer and a dielectric layer in regions directly above conductors arranged within one of the two levels of conductors.

The present invention yet further contemplates an intra-level dielectric structure comprising an air-filled cavity formed below a dielectric layer and between two substantially coplanar polyimide-covered conductors.

BRIEF DESCRIPTION OF THE DRAWINGS

Other objects and advantages of the invention will become apparent upon reading the following detailed description and upon reference to the accompanying drawings in which.

Figure 1:
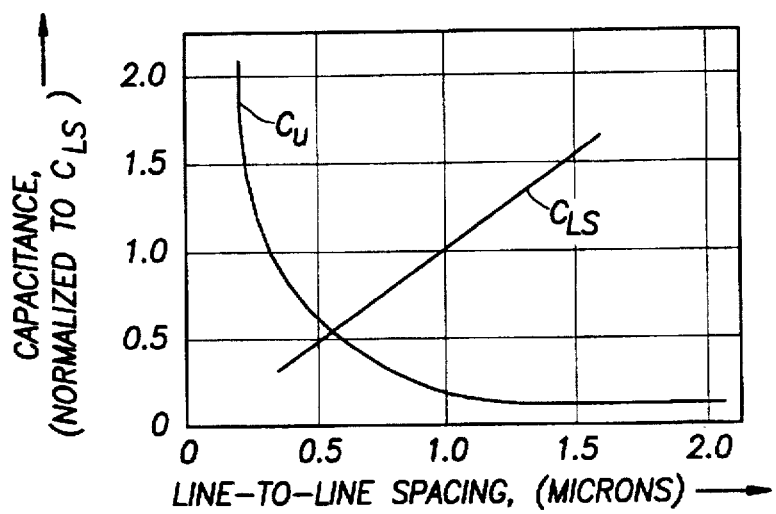
FIG. 1 is a graph of conductor-to-conductor as well as conductor-to-substrate capacitance plotted as a function of line spacing.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
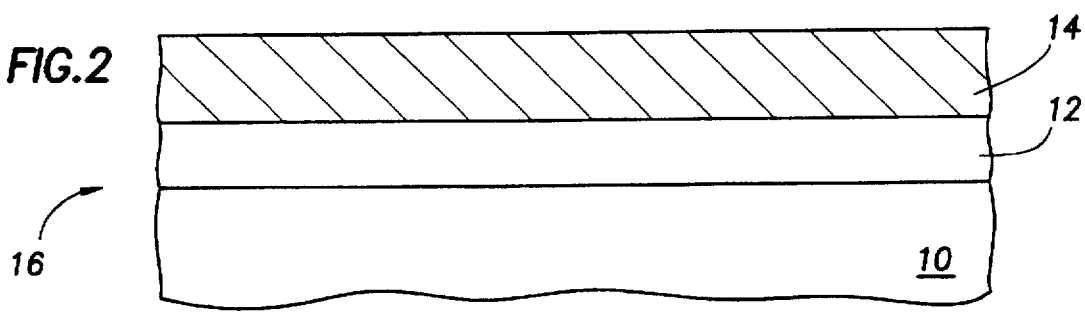
FIG. 2 is a partial cross-sectional view of a semiconductor topography having a conductive layer dielectrically placed upon the topography.

Turning now to the drawings, FIG. 2 illustrates a partial cross-sectional view of a semiconductor topography 10. Placed upon semiconductor topography 10 is an insulative layer 12. Placed upon insulative layer 12 is a conductive layer 14. Semiconductor topography includes an upper surface 16 which comprises either the upper surface of a semiconductor substrate or a dielectric fashioned upon one or more layers of conductors. In the former instance, conductive layer 14 comprises a first layer of conductive material; in the latter instance, layer 14 comprises a second, third, etc. layer of conductive material. In either instance, layer 14 is subsequently fashioned into what will be designated as a first set of conductors, as will be described below. A preferred substrate material includes single crystalline silicon, and insulative layer 12 preferably includes either a grown or deposited $SiO_2$ layer ("oxide").

Figure 3:
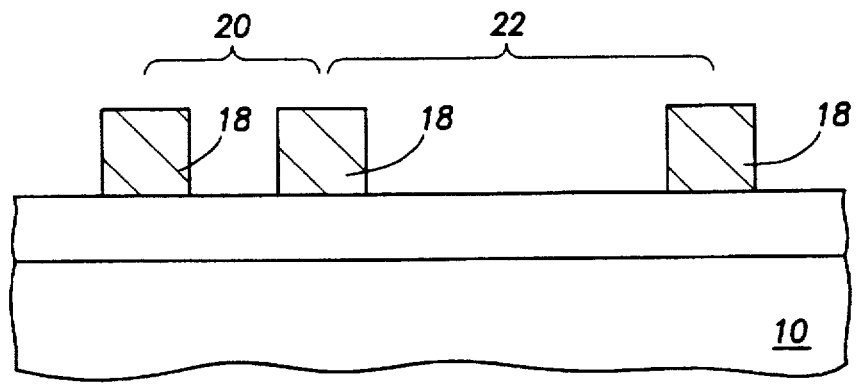
FIG. 3 illustrates a processing step subsequent to that shown in FIG. 2, whereby the conductive layer is patterned to form a first set of conductors.

In a processing step subsequent to that shown in FIG. 2, FIG. 3 illustrates selective removal of conductive layer 14, leaving a first set of conductors 18. Conductors 18 are patterned according to photoresist spin, develop and etch processes generally associated with photolithography. Conductors 18 are thereby formed from the electrically conductive material, leaving regions 20 and 22. Region 20 is illustrated as the pitch distance between closely spaced conductors, and region 22 depicts the pitch distance between sparsely spaced conductors. Closely spaced conductors are herein defined as conductors 18 having a spacing therebetween of less than 10.0 µm (microns). Sparsely spaced conductors are conductors 18 which have a spacing greater than 10.0 microns. FIG. 3 illustrates formation of a set of conductors substantially coplanar to each other within the same level. There may be numerous levels of conductors, of which conductors 18 depict only one of those levels.

Figure 4:
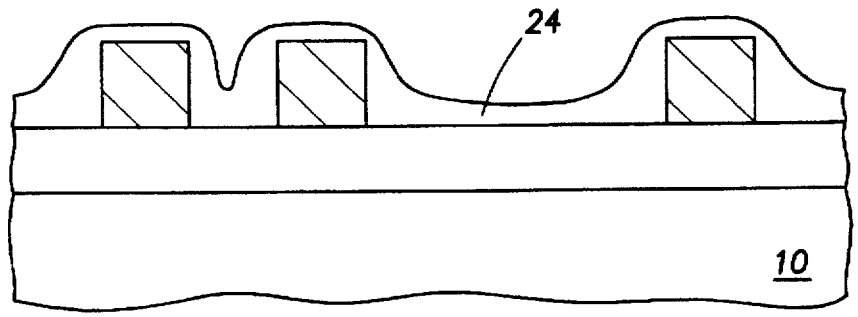
FIG. 4 illustrates a processing step subsequent to that shown in FIG. 3, whereby a polyimide layer is deposited upon and partially between the first set of conductors.

Referring now to FIG. 4, a processing step is shown whereby a polyimide layer 24 is deposited upon and between conductors 18. Polyimide 24 is preferably spin-on deposited in the form of a liquid (polyamic-acid precursor). Subsequently, the deposited material is subjected to a high-temperature cure step, wherein the polyamic-acid undergoes a chemical change (imidization) that causes it to become a solid polyimide film. The cure step suitably involves subjecting the spin-on solution to a temperature of approximately 150° C. for approximately 30 minutes, followed by 300° C. for approximately 60 minutes, or possibly less than 60 minutes.

Polyimide 24 has many advantages: (i) it somewhat planarizes the upper surfaces and reduces step heights and provides a more gentle slope to those step heights (ii) the spin-on liquid material is able to fill small, high-aspect-ratio openings, and (iii) the polyimide film has a relatively high dielectric-breakdown strength. In order to increase the planarization capability, polyimide can be deposited in several applications, if desired. Each application is then followed by a respective cure cycle to drive off the solvent in which the polyamic-acid is dissolved, along with OH and $H_2O$.

Even though the cure cycle minimizes the presence of solvent within polyimide layer 24, there, nonetheless, remains sufficient solvent within polyimide 24.

Figure 5:
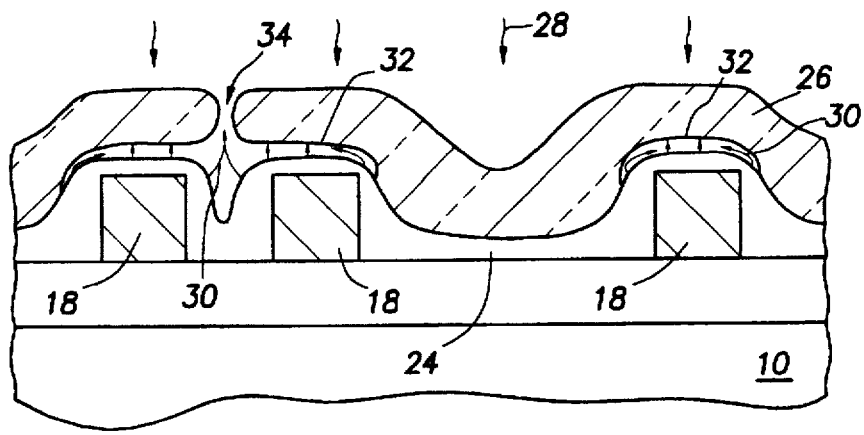
FIG. 5 illustrates a processing step subsequent to that shown in FIG. 4, whereby a dielectric layer is deposited at high temperature (to produce a high temperature dielectric layer) upon the polyimide to form a keyhole in upper elevational regions between densely spaced first set of conductors and also to form air gaps at the junctions between the polyimide and the high temperature dielectric directly above the first of conductors.

FIG. 5 illustrates a processing step subsequent to that shown in FIG. 4. Specifically, FIG. 5 illustrates a high temperature deposition cycle, wherein dielectric 26 is deposited upon polyimide 24. Dielectric 26 is deposited at significantly high temperatures, as compared to the preceeding step in which polyimide 24 is cured. Dielectric 26 is deposited using a chemical-vapor deposition (CVD) reactor. According to one embodiment, dielectric 26 is deposited from a silane source, to form an oxide upon polyimide 24. Depending upon the desired temperature necessary to desorb moisture from polyimide 24, dielectric 26 can be deposited using various CVD techniques, including atmospheric pressure (APCVD), low pressure (LPCVD) or plasma enhanced (PECVD) techniques.

The first layer or layers of dielectric 26 is preferably deposited at temperature exceeding 500° C. The high temperature deposition cycle, denoted as reference numeral 28, causes moisture to outgas from polyimide 24 along the path shown by arrows 30. Thus, polyimide 24 is hygroscopic, in that it readily absorbs water. When subjected to high temperature, any absorbed water or solvent within polyimide 24 will be desorbed. The desorbed moisture will generally expel upward to upper elevational surfaces as shown by arrows 30. Accordingly, outgassing is predominant at the upper elevational surfaces of polyimide 24, and particularly in regions directly above first set of conductors 18. In regions directly above sparsely spaced conductors 18, a air-filled cavity or air gap 32 forms at the juncture between polyimide 24 and high temperature dielectric 26. In regions directly above densely spaced conductors 18, air gaps 32 will also form. In addition, a keyhole will occur at a midline between closely spaced conductors 18. The keyhole, shown as an opening through dielectric 26, is illustrated as reference numeral 34. Keyhole 34 occurs only in areas where significant polyimide 24 exist. It is postulated that keyhole 34 occurs between closely spaced conductors where significant fill of polyimide 24 exist, and not between densely spaced conductors where lesser fill exist. Keyhole 34 remains open during the high temperature deposition cycle since significant outgassing of moisture is forwarded through the opening thereby preventing the closure of that opening. The high temperature deposition cycle continues for a time sufficient to outgas a significant amount of moisture from polyimide 24.

Figure 6:
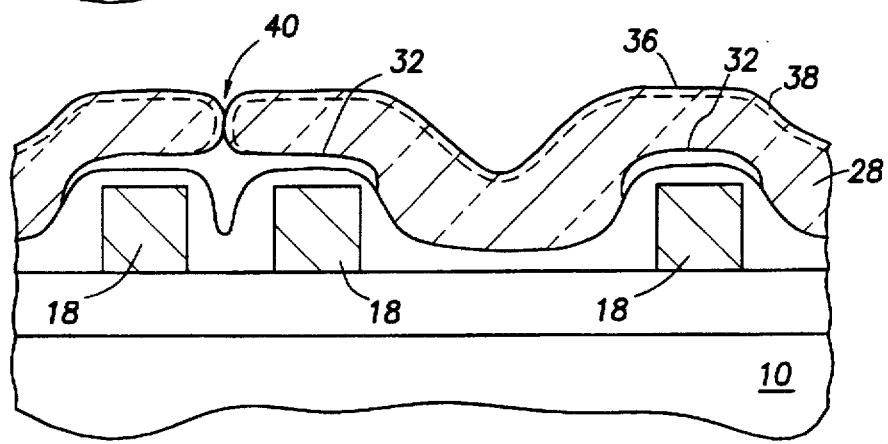
FIG. 6 illustrates a processing step subsequent to that shown in FIG. 5, whereby a dielectric layer is deposited at low temperature (to produce a low temperature dielectric) upon the high temperature dielectric to close the keyhole.

FIG. 6 illustrates a processing step subsequent to FIG. 5, wherein a low temperature deposition cycle is used to complete the formation of an interlevel dielectric 36, which comprises a high temperature dielectric 28, followed by a low temperature dielectric 38. Low temperature dielectric 38 is formed by a CVD process, whereby a dielectric material is deposited at a temperature less than 500° C., and preferably less than 400° C. Lower temperature deposition is chosen such that substantial outgassing of moisture from polyimide 24 does not occur. Minimal outgassing allows deposition of dielectric on the inward facing cusps along the midline between closely spaced conductors. Significant deposition on those cusps causes a closure of keyhole 34, as shown by reference numeral 40.

Closure of keyhole 40 causes encirclement and formation of air gap 32. Air gap 32 is formed not only above closely spaced conductors 18, but also between conductors 18. Air gap 32 extends horizontally across the upper surfaces of closely spaced conductors 18, and vertically between the closely spaced conductors. The vertical extension of air gap 32 exist a spaced distance above the lower surface of conductors 18 to a spaced distance above the upper surface of spaced conductors 18.

Figure 7:
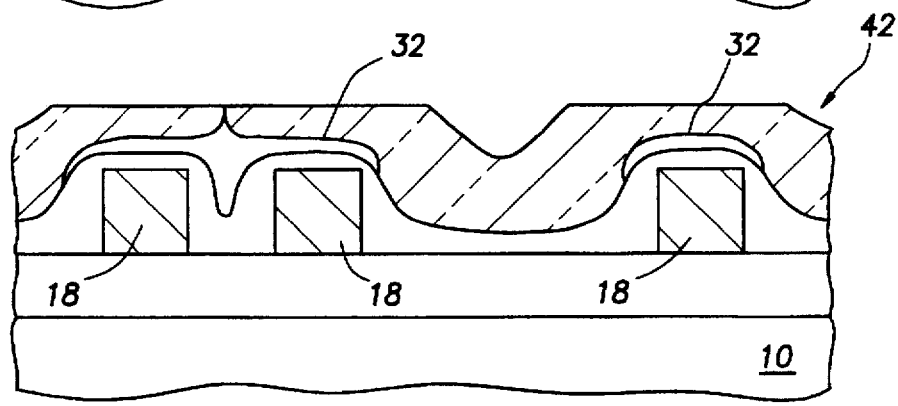
FIG. 7 illustrates a processing step subsequent to that shown in FIG. 6, whereby the low and high temperature dielectrics are planarized according to an exemplary embodiment.

Referring now to FIG. 7, a processing step is shown subsequent to that of FIG. 6. FIG. 7 illustrates a planarization step which can be performed on the upper surface of dielectric 36. Planarization step may or may not be used, depending upon the amount of planarization needed. For example, if significant planarization is not needed, the steps shown in FIG. 7 need not be performed. However, in high density CMOS applications, planarization is generally employed on the dielectric, as shown by new upper surface 42. Upper surface 42 is lower than the original dielectric surface, and is preferably planarized using various techniques including, for example, chemical-mechanical polish (CMP), sacrificial etchback, and selective (block) etchback.

Figure 8:
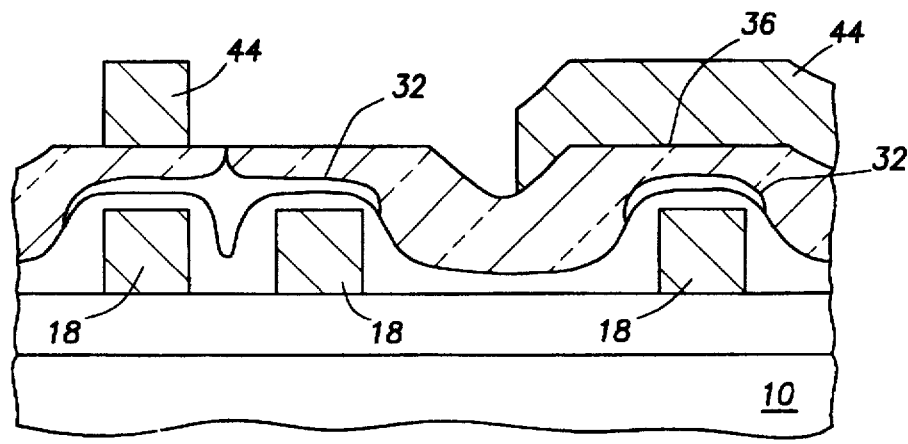
FIG. 8 illustrates a processing step subsequent to that shown in FIG. 7, whereby a second set of conductors are formed upon the planarized dielectric.

The processing step subsequent to that shown in FIG. 7 is presented in FIG. 8. Namely, FIG. 8 depicts formation of a second set of conductors 44 upon the planarized topography of dielectric 36. Conductors 44 are formed by depositing a layer of conductive material, and then selectively removing portions of that conductive layer. The interlayer capacitance $C_{LS}$ between conductors 18 and 44 is significantly reduced by the presence of air gaps 32. Moreover, capacitance between conductors on the same level (i.e., intralevel capacitance $C_{LL}$ is reduced by the presence of air gap 32 between closely spaced conductors 18). The air gaps 32 between conductors 18 extend vertically between at least a portion of the space between conductors 18.

It is understood that the sequence of steps beginning with the steps shown in FIG. 4 can be repeated subsequent to that shown in FIG. 8. Thus, a polyimide layer can be deposited upon the second set of conductors 44, leaving the opportunity for air gap formation in a dielectric placed over conductors 44. The process can be repeated for as many times as needed depending upon the required number of levels. FIG. 8 depicts at least two levels of interconnect (either none or possibly several levels of interconnect beneath topography 10). By repeating the processing sequence set forth hereinabove, numerous levels of interconnect can be fashioned with intralevel and interlevel air gaps selectively positioned to decrease the overall propagation delays of a circuit or circuits formed according to this process. It is intended that the following claims be interpreted to embrace all such modifications and changes and, accordingly, the specification and drawings are to be regarded in an illustrative rather than a restrictive sense.

What is claimed is:

1. A method for forming a dielectric between a first set and a second set of conductors arranged on substantially dissimilar elevational levels, comprising:

forming, in a single patterning step, a first set of conductors spaced from each other upon a dielectric-covered semiconductor topography;

forming a layer of polymer upon and between said first set of conductors to form a polymer-covered set of conductors;

depositing a dielectric upon and between the polymer-covered set of conductors, wherein said dielectric is deposited in the presence of thermal energy sufficient to form air gaps within said dielectric at a midline between polymer-covered set of conductors which are spaced less than 10.0 microns apart; and forming, in a single patterning step, a second set of conductors spaced from each other upon dielectric.

2. The method as recited in claim 1, wherein said first set of conductors are arranged on substantially the same elevational level below an elevational level in which said second set of conductors reside.

3. The method as recited in claim 1, wherein said forming a layer of polymer comprises:

spin-on depositing a polyamic-acid precursor; and heating said polyamic-acid precursor to a temperature exceeding 150° C.

4. The method as recited in claim 3, wherein said heating step is performed in situ inside a chemical vapor deposition system.

5. The method as recited in claim 3, wherein said heating comprises heating at 150° C. followed by heating at 300° C.

6. The method as recited in claim 3, wherein said heating is performed in situ inside a chemical vapor deposition system.

7. The method as recited in claim 1, wherein said polymer comprises polyimide.

8. The method as recited in claim 1, wherein said depositing a dielectric comprises:

depositing a first oxide upon and between the polymer-covered set of conductors from a silane source at a temperature exceeding 400° C.; and depositing a second oxide upon the first oxide from a silane source at a temperature less than 400° C.

9. A method for forming a dielectric between a first set and a second set of conductors which are arranged on substantially dissimilar elevational levels, comprising:

providing a semiconductor topography upon which an electrically insulative layer is deposited;

depositing a conductive layer upon said insulative layer;

selectively removing portions of said conductive layers to present a first set of conductors;

depositing a polyimide upon and between said first set of conductors;

depositing a first layer of dielectric at a temperature sufficient to outgas moisture from said polyimide and through an opening formed within said dielectric, wherein said opening extends along a midline between a select pair of said first set of conductors;

depositing a second layer of dielectric at a temperature sufficient to close said opening and encapsulate an air gap within said first and second layers of dielectric; and forming a second set of conductors upon said second layer of dielectric.

10. The method as recited in claim 9, wherein said semiconductor topography consists essentially of a silicon substrate.

11. The method as recited in claim 9, wherein said semiconductor topography consists essentially of dielectrically covered interconnects.

12. The method as recited in claim 9, wherein said first and second set of conductors each comprise refractory metal.

13. The method as recited in claim 9, wherein said depositing a polyimide comprises spin-on depositing a liquid of polymeric acid followed by heating said liquid to a temperature sufficient to solidify said liquid.

14. The method as recited in claim 9, wherein said polyimide is hygroscopic.

15. The method as recited in claim 9, wherein said depositing a first layer of dielectric occurs at a temperature higher than said depositing a second layer of dielectric.

16. The method as recited in claim 9, wherein said air gap extends vertically a spaced distance above said polyimide.

17. A method for forming a dielectric between a first set and a second set of conductors which are arranged on substantially dissimilar elevational levels, comprising:

providing a semiconductor topography upon which an electrically insulative layer is deposited;

depositing a conductive layer upon said insulative layer;

selectively removing portions of said conductive layers to present a first set of conductors;

depositing a polyimide upon and between said first set of conductors;

depositing a dielectric at a temperature sufficient to outgas moisture from said polyimide to upper elevational regions of said polyimide, whereby air gaps are formed at a juncture between said dielectric and said polyimide directly above said first set of conductors;

forming a second set of conductors upon an upper surface of said dielectric.

* * * * *